(12) United States Patent
Feil

(10) Patent No.: US 6,365,440 B1
(45) Date of Patent: Apr. 2, 2002

(54) METHOD FOR CONTACTING A CIRCUIT CHIP

(75) Inventor: Michael Feil, Munich (DE)

(73) Assignee: Fraunhofer-Gesellschaft Zur Forderung Der Angewandten Forschung E.V., Munich (DE)

( * ) Notice: Subject to any disclaimer, the term of this patent is extended or adjusted under 35 U.S.C. 154(b) by 0 days.

(21) Appl. No.: 09/786,132

(22) PCT Filed: Aug. 27, 1999

(86) PCT No.: PCT/EP99/06311

§ 371 Date: Jul. 16, 2001

§ 102(e) Date: Jul. 16, 2001

(87) PCT Pub. No.: WO00/14679

PCT Pub. Date: Mar. 16, 2000

(30) Foreign Application Priority Data

Sep. 3, 1998 (EP) ............................................. 19840193
Oct. 1, 1998 (EP) ............................................. 19845296

(51) Int. Cl.[7] ........................ H01L 21/44; H01L 21/48; H01L 21/50

(52) U.S. Cl. ...................... 438/125; 438/106; 438/118; 438/121

(58) Field of Search ................................ 438/106, 118, 438/121, 125

(56) References Cited

U.S. PATENT DOCUMENTS 5,155,068 A   10/1992   Tada ............................ 437/211

FOREIGN PATENT DOCUMENTS

| DE | 134471   | 2/1979  | ........... H01L/21/58 |
| DE | 4207874  | 3/1992  | ........... H05K/13/01 |
| DE | 4304422  | 2/1993  | ........... G02B/23/24 |
| DE | 4432254  | 9/1994  | ........... B22D/11/10 |
| DE | 4433845  | 9/1994  | ........... H01L/21/98 |
| DE | 19642378 | 10/1996 | ......... G06K/19/077 |
| DE | 19713799 | 4/1997  | ............ G07C/3/00 |
| DE | 29813738 | 7/1998  | ............ G09F/3/01 |

*Primary Examiner*—John F. Niebling
*Assistant Examiner*—David A. Zarnda
(74) *Attorney, Agent, or Firm*—Michael A. Glenn

(57) ABSTRACT

In a method for contacting a circuit chip containing an integrated circuit of a thickness less than 50 $\mu$m, which has at least two pads on a first main surface, the circuit chip is first of all placed onto a main surface of a support substrate with a second main surface which faces this first main surface, in such a way that the entire thickness of the circuit chip protrudes from the surface of the support substrate. A structured metallic coating is then applied to the first main surface of the circuit chip and the surface of the support substrate by means of screen printing or stamping, in order to connect the pads of the circuit chip to a conductor structure located on the main surface of the support substrate. Alternatively, the screen printing or stamping process is used to apply a structured metallic coating to the first main surface of the circuit chip and the surface of the support substrate, in order to produce a peripheral conductor structure, which is connected to the pads of the circuit chip, on the main surface of the support substrate and on the first main surface of the circuit chip.

8 Claims, 1 Drawing Sheet

METHOD FOR CONTACTING A CIRCUIT CHIP

BACKGROUND OF THE INVENTION

1. Field of the Invention

This invention relates to methods for contacting circuit chips, in particular circuit chips which have been attached to the surface of a support substrate.

2. Description of Prior Art

Chip cards without external contacts which use transponders for the transfer of energy and data are increasingly used in applications. Examples are the medical insurance card, bank cards, or credit cards which are currently still frequently equipped with contacts. The general trend is to build these cards using as thin a construction as possible. Currently, the usual thickness of the integrated circuits used in chip cards is still 150 $\mu$m and above, with a trend towards the use of thinner chips of 100 $\mu$m approximately being observable.

For current applications which go beyond chip cards and provide the combination of integrated circuits with paper or materials similar to paper, such as electronic labels, it would be advantageous to use circuit chips of a thickness markedly below 50 $\mu$m, with the size striven for being approximately 10 $\mu$m. Examples of such applications are described in DE 4432254, DE 19713799.7 or DE 19739474.4. The applications mentioned above have to be classed as belonging to the lower price sector, for which, however, huge numbers of such chip cards or electronic labels have to be manufactured in order to maintain the constant aim to minimize manufacturing costs.

There are currently no publications about the use of silicon chips of a thickness of less than 50 $\mu$m. From multi-chip module applications it is known that chips are embedded in recesses in the support substrate. For this purpose, a recess is made in the support substrate, which may only be minimally larger than the chip to be embedded. Then the chip is inserted into the recess in the substrate. In order to ensure that chip and substrate surface are as flush as possible, both parts are laid with their upper surface downwards onto a plane glass plate. The gap between chip and substrate is then filled with a polymer, which, on the one hand, holds the chip in the recess and, on the other hand, produces a smooth transfer from the chip to the substrate on the upper surface. In this way, a quasi-planar surface is created. The connections between the chip and its surrounding are then achieved using thin film technology. In this way, further strip conductors, including conductors running across the chip, can be applied. The method described above is, however, much too costly and expensive for the mass production of transponder chips or electronic labels using the transponder technology.

A further possibility for the contacting of thin chips is the flip-chip connection technique. Using this technique the chip is soldered or glued with the active side downwards onto a corresponding connection area of the substrate. In order to assure a reliable contact, the connection areas are equipped with so-called bumps. These are metallic protuberances. However, the thickness of such a connection usually is markedly above 30 $\mu$m, in most cases even above 50 $\mu$m. In order to be able to make use of the advantages of a rather thin structure by use of the flip-chip connection technique, major developmental efforts to reduce the thickness of the connection joints would be required. For this purpose, the wafers are thinned from the back, for which they have to be attached to an auxiliary or intermediate support. In order to make the active side accessible for the flip-chip connection technique, a subsequent re-bonding on another intermediate support is required. The flip-chip connection technique is therefore, on the one hand, not suitable for producing a flat connection and, on the other hand, on account of the afore-mentioned difficulties arising from the re-bonding extensive.

DD 13 44 71 provides a method for connecting a semiconductor chip to support bodies, wherein an insulating layer is first formed on the support body. The insulating layer has a recess into which a semiconductor chip is subsequently inserted, in such a way that the surface of the semiconductor chip is flush with the surface of the insulating layer. The contact to the semiconductor chip is then made by screen printing onto the surface of the semiconductor chip and the surface of the insulating layer.

U.S. Pat. No. 5,155,068 A shows a method for the manufacture of an IC module for a chip card, wherein after its manufacture the IC module is inserted into a recess in the chip card.

DE 196 42 378 A1 describes a contactless chip card, with which a chip is located basically flush in a chip card substrate. In addition, on the chip card substrate, a coil structure is located in such a way that the same extends to the pads of the chip.

DE 44 31 606 A shows a chip card module, in which a chip is adhered into a recess in a support body, whereby the chip partially protrudes from the support body. Ends of a varnished wire coil located on the support body are soldered to the connection surfaces of the chip. From H. Wada, T. Kamijoh, IEEE J. of Selected Topics in QE, Vol. 3, No. 3, June 1997, pages 937–942, it is known that double heterostructures of an edge-emitting InP-InGaAsP laser applied to a silicon substrate by means of wafer bonding can show a small thickness in the region of for example 3 $\mu$m.

SUMMARY OF THE INVENTION

It is the object of the present invention to provide methods by which, very cost effectively, in a single process, one the one hand, the electrical contacting of a thin circuit chip to the peripheral conductor structure can be made and, on the other hand, simultaneously, with the production of the peripheral conductor structure, the connections to the thin circuit chip are made.

According to a first aspect of the invention, this object is achieved by a method for contacting a circuit chip containing an integrated circuit of a thickness less than 50 $\mu$m, which has at least two pads on its upper side, comprising the steps of:

placing the circuit chip with its underside onto a surface of a support substrate, in such a way that the entire thickness of the circuit chip protrudes from the surface of the support substrate; and applying a structured metallic coating to the upper face of the circuit chip and to the surface of the support substrate by means of screen printing or stamping in order to connect the pads of the circuit chip to a conductor structure located on the upper surface of the support substrate.

According to a second aspect of the invention, this object is achieved by a method for contacting a circuit chip containing an integrated circuit of a thickness less than 50 $\mu$m, which has at least two pads on its upper side, comprising the steps of:

placing the circuit chip with its underside onto a surface of a support substrate, in such a way that the entire thickness of the circuit chip protrudes from the surface of the support substrate; and applying a structured metallic coating to the upper face of the surface chip and to the surface of the support substrate by means of screen printing or stamping in order to produce a peripheral conductor structure, which is connected to the pads of the circuit chip, on the surface of the support substrate and the upper side of the circuit chip.

The present invention is based on the knowledge that, when using thin circuit chips of thickness less than 50 µm, preferably in a range from 10 to 20 µm, it is possible to carry out a screen printing process or stamping for making contact to the pads located on the upper side of the circuit chip, even when the chip is placed on the upper surface of the support substrate. Therefore it is not necessary to sink the circuit chip into the support substrate by means of a costly process. Thereby the method according to the invention allows extremely cost effective manufacture of, for example, transponder modules for insertion into IC cards or electronic labels.

The method described can be applied especially advantageously to integrated circuits, i.e. circuit chips, with few pads, i.e. terminal areas, for example transponders with only two pads for the coil, since here at the lateral structural resolution no very great demands are being made because the coil printed simultaneously to the contacts does not exhibit a complex structure.

The methods according to the invention are advantageous especially with regard to economy and flexibility. For example, transponder modules can be manufactured in multiple printed panels and/or from roll to roll, with piece rates of several thousand per hour being possible. On account of the flatness of the finished structure, realized by means of the method according to the invention, it is possible without further consideration to laminate the structure into thin media such as paper. Therefore the thickness of today's chip cards, which usually is approximately 0.7 mm, can be reduced to approximately 0.2 mm.

Further developments in the methods according to the invention are described in the dependent claims.

BRIEF DESCRIPTION OF THE DRAWINGS

Preferred embodiments of the present invention are described in more detail with reference to the following appended drawings, in which.

DESCRIPTION OF PREFERRED EMBODIMENTS OF THE INVENTION

Before the preferred embodiments of the method according to the invention are described in more detail below, the following fundamental points will be considered. The basic materials of the invention are circuit chips, i.e. integrated circuits, which are so thin, that after the chip has been placed on a support substrate, which is normally realised by the adhering on of the same, the resulting step on the chip card is very small. Regarding this, the present invention assumes a maximum thickness of the circuit chip of 50 µm, wherein the actual thickness is preferably between 10 and 20 µm. Therefore the above mentioned resulting step no longer represents an obstacle to the established screen printing process or stamping techniques. Hence it is possible to carry out in a single step both the making of the contacts to the integrated circuit and the production of a conductor structure on the support substrate.

The circuit structure of the chip used is, as is usual in mass production, completed while the circuit chips are still to be found in the wafer compound. After the circuit has been completed in the front side of the wafer, an intermediate support is placed on this front side, whereupon the wafer is thinned from the rear side. After this the circuit chips are separated from one another, and in the case of a rigid intermediate support, which advantageously is a transparent glass plate, this will also be divided up. If a flexible intermediate support, for example a film, is used, only the thinned wafer will be divided. These separated, thin circuit chips with a thickness of less than 50 µm, preferably in a range from 10 to 20 µm, form the basis of the method according to the invention.

Figure 1:
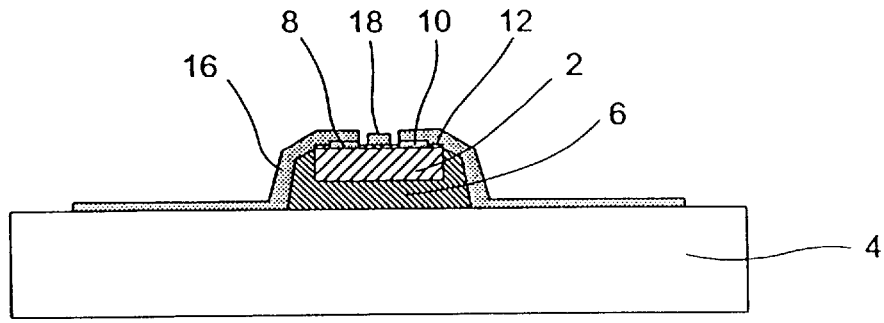
FIG. 1 is a schematic cross-sectional view of a transponder module which was manufactured by the method according to the invention.

As shown in FIG. 1, such a thin circuit chip 2 is placed with a main surface of the same onto the main surface of the support substrate 4 in accordance with the present invention. For this purpose any substrate of small thickness can be used as the support substrate, for example a flexible polymer film. The circuit chip 2 is preferably adhered to the support substrate 4 by means of a bonding agent, wherein the thickness of the adhered joint 6 is to be made as a small as possible. An example of the thickness of the adhered joint is 1 to 2 µm. At the same time, on placing the circuit chip 2 onto the circuit substrate 4, or afterwards, the intermediate support (not shown) is removed from the circuit chip 2, where the intermediate support was applied to the circuit chip by means, for example, of a hot-melt adhesive, an adhesive film or a double-sided adhesive film with different adhesive properties on each side. If a flexible intermediate support is used, the chip can be "stamped off" the flexible intermediate support.

As shown in FIG. 1, the circuit chip 2 has two pads 8 and 10 on the main surfaces thereof spaced from the support substrate 4. In order to guarantee making contact to the circuit chip 2 as simple as possible, these pads 8 and 10 are to made with an as large as possible area. The circuit chip 2 preferably is to, or will, be provided with a passivation layer on the first main surface, excepting the areas in which the pads 8, 10 are located, in order to electrically isolate the edges of the chips from the metallic coating or conductor structure arranged thereon.

In the embodiment depicted in FIG. 1, the circuit chip is pressed into an electrically non-conducting adhesive 6 provided on the support substrate 4, in such a way that the edges of the circuit chip 2 are covered with adhesive, however without the adhesive getting onto the pads 8 and 10 of the circuit chip 2. Therefore the sides of the circuit chip 2 are already covered with an insulating layer, so that no further insulation is required before a metallic coating step takes place.

Figure 2:
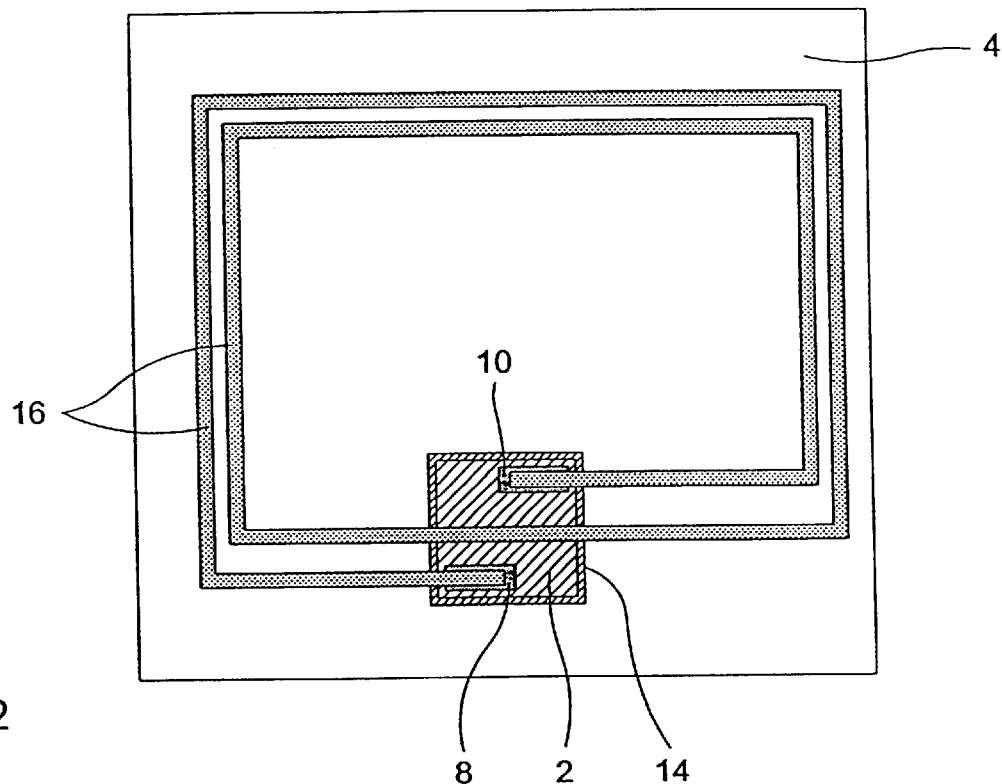
FIG. 2 is a top view for the transponder module shown in FIG. 1.

Following this, in an embodiment of the present invention, a conductor structure 16, see particularly FIG. 2, is applied to the support substrate 4 and the circuit chip 2, by means of screen printing or stamping, in such a way that, firstly, the same defines a peripheral conductor structure in the form of an antenna coil, and that, secondly, it is connected to the pads 8,10 of the circuit chip 2. For applying the metallic coating layer, conductive pastes having properties adapted to the support substrate material are used. After having applied this metallic coating, the transponder module possesses the structure shown in Fig.1 and FIG. 2, wherein regions of coil metallic coating, see for example 18 in FIG. 2, extend over the circuit chip 2, in order to avoid an otherwise necessary bridging metallization.

Figure 3:
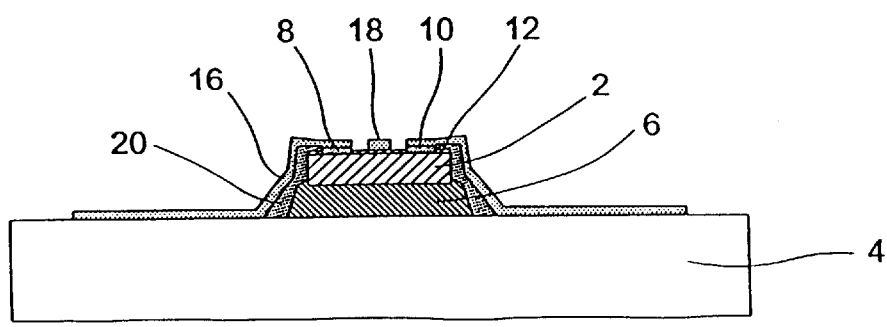
FIG. 3 is a schematic cross-sectional view of a transponder module which was manufactured by means of an alternative embodiment of the method according to the invention.

According to an alternative embodiment of the method according to the invention, the conductor structures, which define the antenna coil, can already be available on the support substrate, wherein, by using the screen printing process or the stamping process, only the connections of the pads to the already available conductor structure or the section of the coil metallic coating extending over the circuit chip 2 are formed. In FIG. 3, a schematic cross-sectional view of a transponder module is shown, which was manufactured by means of an alternative embodiment of the method according to the invention. Here the components are referred to in the same way as their equivalents in FIGS. 1 and 2. In the transponder module shown in FIG. 3, the chip had not been pressed into an electrically conducting adhesive in such a way that the sides of the chip were already completely covered with adhesive. Rather, before the application of the metallic coating layer 16 was made here, an additional insulating layer 20 was applied to the edges of the circuit chip 2. This application can be made, for example, by deposition, stamping or screen printing.

The present invention creates therefore an extremely simple method for making contacts to a circuit chip, which can be advantageously applied to the manufacture of ultra-flat modules, for example transponder modules. In so doing, the present invention exploits the use of ultra-flat circuit chips in that it has been recognized that despite the placing of such a chip directly onto the surface of a support substrate, screen printing processes or stamping processes for applying metallic coating layer can be employed for effecting contacting to the pads located on the upper side of the circuit chip.

What is claimed is:

1. Method for contacting a circuit chip containing an integrated circuit of a thickness less than 50 $\mu$m, which has at least two pads on its upper side, comprising the steps of:

placing the circuit chip with its underside onto a surface of a support substrate, in such a way that the entire thickness of the circuit chip protrudes from the surface of the support substrate; and applying a structured metallic coating to the upper face of the circuit chip and to the surface of the support substrate by means of screen printing or stamping in order to connect the pads of the circuit chip to a conductor structure located on the upper surface of the support substrate.

2. Method for contacting a circuit chip in accordance with claim 1, wherein the circuit chip is placed onto the surface of the support substrate by means of an auxiliary support.

3. Method for contacting a circuit chip in accordance with claim 1, wherein the circuit chip is adhered to the surface of the support substrate.

4. Method in accordance with claim 3, wherein a layer of bonding agent is provided on the support substrate, in which the circuit chip is pressed in such a way that the edges of the circuit chip are insulated by the layer of bonding agent.

5. Method for contacting a circuit chip containing an integrated circuit of a thickness less than 50 $\mu$m, which has at least two pads on its upper side, comprising the steps of:

placing the circuit chip with its underside onto a surface of a support substrate, in such a way that the entire thickness of the circuit chip protrudes from the surface of the support substrate; and applying a structured metallic coating to the upper face of the surface chip and to the surface of the support substrate by means of screen printing or stamping in order to produce a peripheral conductor structure, which is connected to the pads of the circuit chip, on the surface of the support substrate and the upper side of the circuit chip.

6. Method for contacting a circuit chip in accordance with claim 5, wherein the circuit chip is placed onto the surface of the support substrate by means of an auxiliary support.

7. Method for contacting a circuit chip in accordance with claim 5, wherein the circuit chip is adhered to the surface of the support substrate.

8. Method in accordance with claim 7, wherein a layer of bonding agent is provided on the support substrate, in which the circuit chip is pressed in such a way that the edges of the circuit chip are insulated by the layer of bonding agent.

* * * * *